United States Patent [19]

Moll

[11] Patent Number: 5,497,012
[45] Date of Patent: Mar. 5, 1996

[54] UNIPOLAR BAND MINIMA DEVICES

[75] Inventor: Nicolas J. Moll, La Honda, Calif.

[73] Assignee: Hewlett-Packard Company, Palo Alto, Calif.

[21] Appl. No.: 259,808

[22] Filed: Jun. 15, 1994

[51] Int. Cl.$^6$ ............... H01L 31/0328; H01L 29/06; H01L 31/0336; H01L 31/072
[52] U.S. Cl. ............... 257/183; 257/11; 257/18; 257/183.1; 257/191
[58] Field of Search ............... 257/12, 15, 18, 257/26, 29, 183, 183.1, 191, 199, 200, 497, 184, 4, 6, 11, 25

[56] References Cited

U.S. PATENT DOCUMENTS

| | | | |
|---|---|---|---|
| 4,829,343 | 5/1989 | Levi | 357/4 |
| 5,250,815 | 10/1993 | Battersby et al. | 257/6 |
| 5,258,624 | 11/1993 | Battersby et al. | 257/11 |
| 5,296,721 | 3/1994 | Schulman et al. | 257/25 |

OTHER PUBLICATIONS

A. F. J. Levi & T. H. Chiu, "Room–Temperature Operation of Hot–Electron Transistors", Applied Physics Letters vol. 51, No. 13, Sep. 28, 1987, pp. 984–986.
M. Guzzu and J. L. Staehli, "Band Structure of the GaAs/AlAs Solid Solutions", Solid State Phenomena, vol. 10, 1989, pp. 25–52.
S. M. Sze, Article 2.7.5 Fast Recovery Diode, Physics of Semiconductor Devices, 2nd edition, Wiley & Sons, p. 116.
S. M. Sze, Article 2.6 Transient Behavior and Noise, Physics of Semiconductor Devices, 2nd edition, Wiley & Sons, pp. 108–111.
S. M. Sze, Article 11.2.2 Physics of Semiconductor Devices, 2nd edition, Wiley & Sons, pp. 645–651.
R. A. Smith, Wave Mechanics of Crystalline Solid, Chapman & Hall, 1968.
M. E. Kim, A. Das, and S. D. Senturia, "Electron scattering interaction with coupled plasmon–polar–phonon modes in degenerate semiconductors", Physical Review B. vol. 18, No. 12, Dec. 15, 1978, pp. 6890–6899.
A, F. J. Levi, J. R. Hayes, P. M. Platzman and W. Wiegmann, "Hot electron Spectroscopy of GaAs", Physica 134B (1985), Elsevier Science Publishers B.V., pp. 480–486.
M. Heiblum, M. I. Nathan, D. C. Thomas, and C. M. Knoedler, "Direct Observation of Ballistic Transport in GaAs", Physical Review Letters, vol. 55, No. 20, Nov. 11, 1985, pp. 2200–2203.
T. S. Moise, A. C. Seabaugh, E. A. Beam III, Y. C. Kao, and J. N. Randall, "Room–Temperature Operation of inGaAs–based Hot–Electron Transistors", 51st Device Research Conference, paper VB–2 (1993).
Robert H. Kingston, "Switching Time in Junction Diodes and Junction Transistors", Proc. IRE, vol. 42, (1954), pp. 829–834.

Primary Examiner—Steven H. Loke

[57] ABSTRACT

A semiconductor diode for providing a reduced recovery time at room temperature independent of any minority carrier recombination. The diode of the present invention comprises a first semiconductor material having a type of majority carriers and having a sub-band ordering associated with the majority carriers. The diode further comprises a second semiconductor material contacting the first material at a heterojunction, the second semiconductor material having the same type of majority carriers as the first semiconductor material and having a sub-band ordering associated with the majority carriers that is different from that of the first semiconductor material. It is theorized that the semiconductor diode of the present invention has a recovery time dependent upon scattering of carriers to various energy sub-bands within a heterojunction of the two different semiconductor materials. The diode of the present invention provides a reduced recovery time since a time of such scattering is extremely short.

20 Claims, 6 Drawing Sheets

UNIPOLAR BAND MINIMA DEVICES

FIELD OF THE INVENTION

The present invention generally relates to semiconductor devices and more particularly relates to semiconductor diodes,

BACKGROUND OF THE INVENTION

Semiconductor diodes are useful in a number of electronic applications. A non-linear response characteristic of such diodes provides for applications in rectification of electrical wave forms. Additionally, the non-linear response characteristic of diodes provides for clipping or limiting of such wave forms. The non-linear response characteristic of diodes further provides for waveform sampling and frequency mixing applications.

In general, the non-linear response characteristic of semiconductor diodes is dependent on a voltage applied thereto. For example a forward bias voltage applied to a semiconductor diode provides for forward conduction through the diode. In contrast, a reverse bias voltage applied to the semiconductor diode substantially prevents reverse conduction through the diode.

A popular type of semiconductor diode is known as a p-n junction diode. A p-n junction diode often comprises a single semiconductor material that includes two differently doped regions. A first one the regions is doped with p-type impurity so that holes are majority carriers of current flow therethrough and electrons are minority carriers. A second one of the regions is doped with n-type impurity so that electrons are majority carriers of current flow therethrough and holes are minority carriers. The two regions contact each other at a p-n junction.

A "switching time" or "recovery time" in which the diode is switched from the forward conduction to the reverse conduction is important in the diode applications discussed previously herein. In p-n junction diodes such switching time or recovery time is substantially limited by behavior of minority carriers in p-n junction diodes, as discussed for example in Physics of Semiconductor Devices, Chapter 2: p-n Junction diode, by S. M. Sze, pages 63–132, John Wiley (1981). A particularly helpful discussion of such limitations is found in section 2.6.1 of Chapter 2 of Sze, pages 108–111, which is incorporated herein by reference.

Various methods have been used to provide decreased recovery time in p-n junction diodes. So called "fast recovery diodes" are discussed in section 2.7.5 of Chapter 2 of Sze (page 116 incorporated by reference). In fast recovery diodes, minority carrier lifetime in the junction is reduced by introducing recombination centers, thereby reducing recovery time. For example, by introducing Gold recombination centers into Silicon semiconductor diodes, recovery times in a range of 1 to 5 nanoseconds are achieved. By introducing suitable recombination centers into GaAs semiconductor diodes, recovery times on the order of 0.1 nanoseconds are achieved.

Unfortunately, it is not possible to reduce recovery times to zero by introducing an extremely large number of recombination centers, because a reverse generation current of a p-n junction is proportional to the number of recombination centers. Accordingly, while introduction of recombination centers provides some limited improvement in recovery time, an alternative is desirable. Furthermore, while experimental devices operating at cryogenic temperatures provide some interesting effects, equipment needed to maintain such temperatures adds undesirable burdens. What is need is a semiconductor diode that provides a reduced recovery time, at room temperature, independent of any minority carrier recombination.

SUMMARY OF THE INVENTION

A semiconductor diode of the present invention provides a reduced recovery time, at room temperature, independent of any minority carrier recombination. Previously known GaAs p-n junction diodes having recovery times dependent upon recombination centers introduced therein provided recovery times on the order of 0.1 nanoseconds. In contrast, it is theorized that the semiconductor diode of the present invention has a recovery time dependent upon scattering of carriers to various energy sub-bands within a heterojunction of two different semiconductor materials. Since a time of such scattering is extremely short, it is theorized that the diode of present invention provides a recovery time on the order of 1 picosecond or less at room temperature.

Briefly, and in general terms, the diode of the present invention comprises a first semiconductor material having a type of majority carriers and having a sub-band ordering associated with the majority carriers. The diode further comprises a second semiconductor material contacting the first material at a heterojunction, the second semiconductor material having the same type of majority carriers as the first semiconductor material and having a sub-band ordering associated with the majority carriers that is different from that of the first semiconductor material. For example, in a preferred embodiment, the majority carriers of the first and second semiconductor materials are electrons. Accordingly, in the first semiconductor material the sub-band ordering associated with the majority carriers is a conduction sub-band ordering associated with the electrons. Similarly, in the preferred embodiment, the sub-band ordering associated with the majority carriers in the second semiconductor material is a conduction sub-band ordering that is different from the conduction sub-band ordering of the first semiconductor material.

Electrical contacts are coupled to the first and second semiconductor materials for applying a voltage to control a flow of the majority carriers across the heterojunction. Applying a forward bias to the heterojunction provides a flow of the majority carriers across the heterojunction. Applying a reverse bias to the heterojunction substantially prevents the flow of carriers across the heterojunction.

Preferably, the first material is an indirect material, such as an AlAs/GaAs superlattice, which has a number of conduction sub-bands arranged in a sub-band ordering. For example, the AlAs/GaAs superlattice has a Brillouin zone including a conduction band main minimum at a bottom of the conduction band that is located at an X point in k-space (the terminology used to describe the band structure is conventional and well known to those skilled in the art), a next lowest conduction band satellite minimum that is located at a Gamma point in k-space, and a next lowest conduction band satellite minimum that is located at an L point in k-space. Accordingly, the conduction sub-band ordering of the superlattice of the first material is X-Gamma-L Preferably, the second material is a direct material, such as an InGaAs alloy, which has a number of conduction sub-bands arranged in a sub-band ordering that is different than that of the first material. For example, the InGaAs alloy has a Brillouin zone including a conduction band main minimum at a bottom of the conduction band that is located at a Gamma point in k-space, a next lowest conduction band satellite minimum that is located at an L point in k-space, and a next lowest conduction band satellite minimum that is located at an X point in k-space. Accordingly, the conduction sub-band ordering of the InGaAs alloy of the second material is Gamma-L-X, which is substantially different than the X-Gamma-L conduction sub-band ordering of the AlAs/GaAs superlattice.

Although there are corresponding points in k-space in the first and second materials, the respective sub-band orderings of the first and second semiconductor materials are different. Accordingly, the heterojunction includes an energy barrier between sub-bands located at the corresponding points in k-space in the first and second materials. For example, for the AlAs/GaAs superlattice and the InGaAs alloy, although there are corresponding X points in k-space in the two materials, the sub-band ordering in the superlattice is different than the sub-band ordering in InGaAs. Accordingly, in this example the heterojunction includes an energy barrier between the sub-band located at the X point in the AlAs/GaAs superlattice and the sub-band located at the corresponding X point in the InGaAs alloy. In accordance with the principles of the invention, the second material is sufficiently doped so that under the forward bias the energy barrier is lowered to provide the flow of carriers between sub-bands located at the corresponding points in k-space in the first and second materials. For example, the InGaAs of the second material is sufficiently doped with Silicon so that under the forward bias the energy barrier is lowered to provide the flow of carriers between the sub-band located at the X point in the superlattice of the first material and the sub-band located at the X point in the InGaAs of the second material.

Furthermore, in accordance with the principles of the invention, the heterojunction is sufficiently graded so that under the forward bias an injection energy level of the carriers causes the carriers to pass from a main sub-band at a point in k-space in the first material to the satellite sub-band at the corresponding point in k-space in the second material. For example, in the AlAs/GaAs superlattice and InGaAs alloy, the heterojunction therebetween is sufficiently graded so that under the forward bias an injection energy level of the electrons causes the electrons to pass from the conduction band main minimum at the X point in the superlattice to the conduction band satellite minimum at the corresponding X point in the InGaAs.

Of course, the present invention is not strictly limited to materials having an X-Gamma-L conduction band ordering for the first semiconductor material of the diode, and having a Gamma-L-X conduction sub-band ordering for the second semiconductor materials of the diode. A guiding principle of the invention is that the first semiconductor material of the diode has a sub-band ordering associated with the majority carriers and that the second semiconductor material of the diode has a sub-band ordering associated with the majority carriers that is different from that of the first semiconductor material. Accordingly, other embodiments of the invention have a sub-band ordering for the first semiconductor material of the diode different than that of AlAs/GaAs superlattice. Similarly, it should be understood that some embodiments of the invention have sub-band ordering for the second semiconductor material of the diode different than that of InGaAs.

Furthermore, it should be understood that the present invention is not strictly limited to materials having electrons as majority carriers. Since another guiding principle of the invention is that the first and second semiconductor materials have the same majority carriers, it should be understood that in some alternative embodiments, holes are the majority carriers in the first and second semiconductor materials. Accordingly, in the first semiconductor material the sub-band ordering associated with the majority carriers is a valence sub-band ordering associated with the holes. Similarly, in the second semiconductor material, the sub-band ordering associated with the majority carriers is a valence sub-band ordering that is different from the valence sub-band of the first semiconductor material.

In embodiments having holes as majority carriers, the heterojunction includes an energy barrier between valence sub-bands located at the corresponding points in k-space in the first and second materials. The second material is sufficiently doped so that under the forward bias the energy barrier is lowered to provide the flow of carriers across the heterojunction. The heterojunction is sufficiently graded so that under the forward bias an injection energy level of the carriers causes the carriers to pass from a valence main sub-band at a point in k-space in the first material to the valence satellite sub-band at the corresponding point in k-space in the second material.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1:
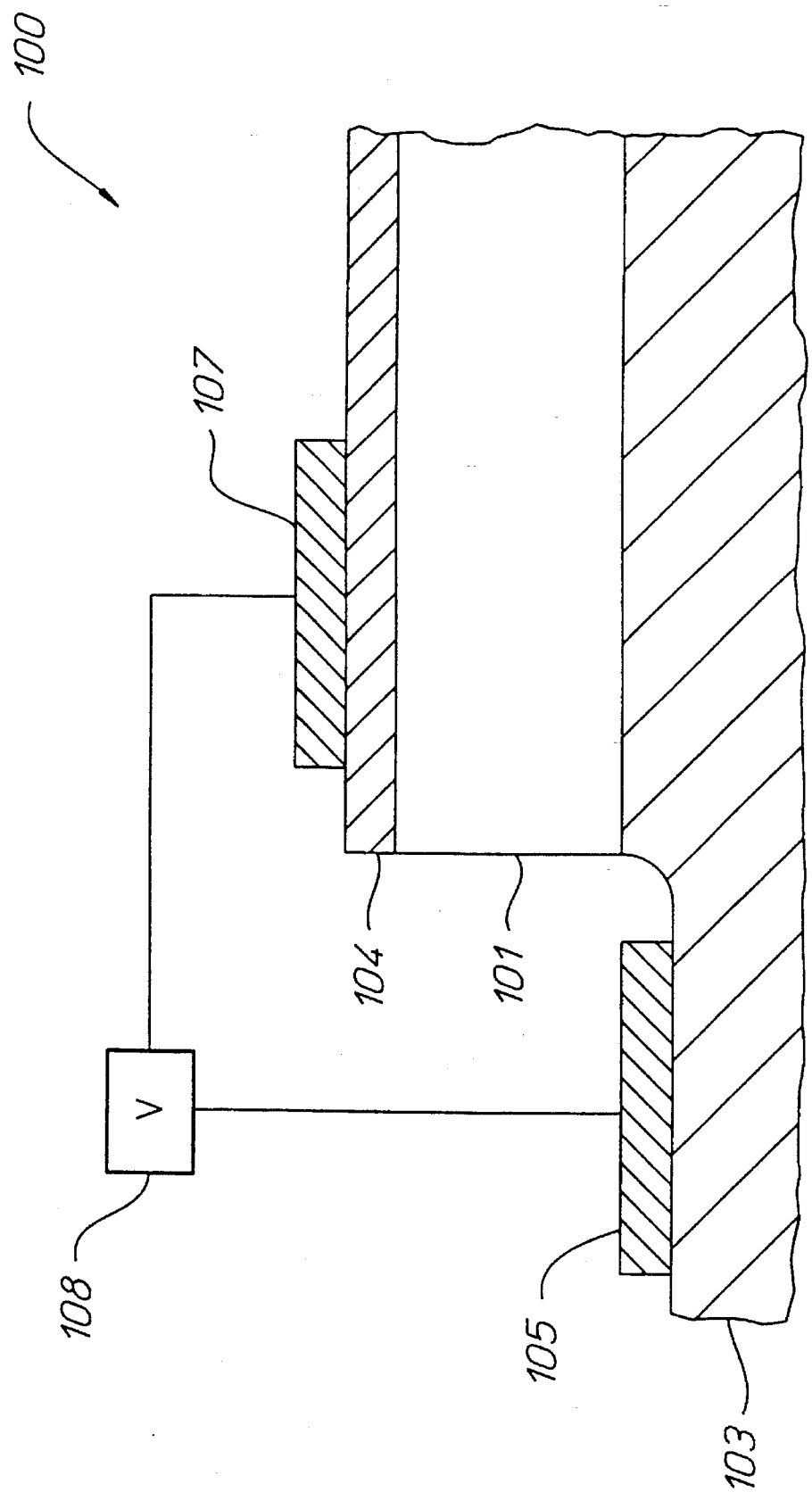
FIG. 1 schematically depicts a diode according to a preferred embodiment of the invention.

FIG. 1 schematically depicts a diode of the invention as preferably embodied in a heteroepitaxial structure 100. As shown the diode of the present invention comprises a first semiconductor material 101, preferably an indirect material comprising an AlAs/GaAs superlattice approximately 420 to 1250 angstroms thick. Growth is done by molecular beam epitaxy lattice-matched to a (100)-oriented GaAs substrate 103, which is doped with five times ten to the eighteenth Silicon atoms per cubic centimeter of the GaAs. The diode further comprises a second semiconductor material 104, preferably a direct material comprising an InGaAs alloy approximately 100–160 Angstroms thick, which contacts the first material at a heterojunction. Growth is done by molecular beam epitaxy onto a GaAs layer of the superlattice.

Electrical contacts 105, 107, preferably MoAu alloy, and a suitable voltage source 108 are coupled to the first and second semiconductor materials for applying voltage to control a flow of the majority carriers across the heterojunction. Preferably, after patterning the heterostructure (substantially in the manner shown in FIG. 1) by standard lithography and etching techniques, the MoAu alloy is evaporated onto the first and second semiconductor materials to form ohmic contacts.

In the preferred embodiment, the first material is doped by putting Si in the GaAs layers. This the best way currently known of achieving high electron concentration in the AlAs/GaAs superlattice grown by molecular beam epitaxy. In the preferred embodiment, the AlAs layers of the superlattice are undoped. Additionally, the heterojunction is sufficiently graded so that under the forward bias an injection energy level of the carriers causes the carriers to pass from a sub-band at a point in k-space in the first material to the sub-band at the corresponding point in k-space in the second material. For example in the preferred embodiment including the AlAs/GaAs superlattice and InGaAs shown in FIG. 1, the heterojunction therebetween is sufficiently graded so that under the forward bias an injection energy level of the electrons causes the electrons to pass from the conduction band main minimum at the X point in the superlattice to the conduction band satellite minimum at the corresponding X point in the InGaAs. Preferably, the heterojunction is graded by varying doping of the GaAs layers of the superlattice and by varying thickness of the GaAs and AlAs layers of the superlattice, while the superlattice is being grown by molecular beam epitaxy.

Accordingly, a preferred method for growing the superlattice is to begin by depositing an initial ten pairs of alternating layers of AlAs and GaAs onto the GaAs substrate 103. Each of the ten initial layers of AlAs has a thickness of 9 ml. Each of the ten initial GaAs superlattice layers has a thickness of 6 mL and is doped with one times ten to the eighteenth Silicon atoms per cubic centimeter of the GaAs. One monolayer, mL, is defined as a single layer of Al and As or Ga and As atoms, which is approximately 0.2827 nanometers thick. The superlattice further has a subsequent four pairs of alternating layers of AlAs and un-doped GaAs deposited at a region where the superlattice is to contact the InGaAs. In a first member of the four pairs, the AlAs layer has a thickness of 9 mL, and the GaAs layer has a thickness of 6 mL. In a second member of the four pairs, the AlAs layer has a thickness of 8 mL, and the GaAs layer has a thickness of 6 mL. In a third member of the four pairs, the AlAs layer has a thickness of 6 ml, and the GaAs layer has a thickness of 6 mL In a fourth member of the four pairs, the AlAs layer has a thickness of 4 mL, and the GaAs layer has a thickness of 4 ml. Accordingly, the superlattice layers are thinnest near the heterojunction.

In accordance with the principles of the invention, the second material is sufficiently doped so that under the forward bias the energy barrier is lowered to provide the flow of carriers across the heterojunction. For example, in the second material the InGaAs is sufficiently doped with Silicon so that under the forward bias the energy barrier is lowered to provide the flow of carriers across the heterojunction. The preferred second material 104 is pseudomorphic InGaAs with an InAs mole fraction on the order of 0.25, and doped with 2 times ten to the nineteenth Silicon atoms per cubic centimeter of the InGaAs. Use of this second material in conjunction with the first material gives good diode characteristics. It is theorized that this is partly due to a built in strain in the second material. Higher electron concentrations are achieved in InGaAs than in GaAs, which is desirable for low resistance.

Figure 2:
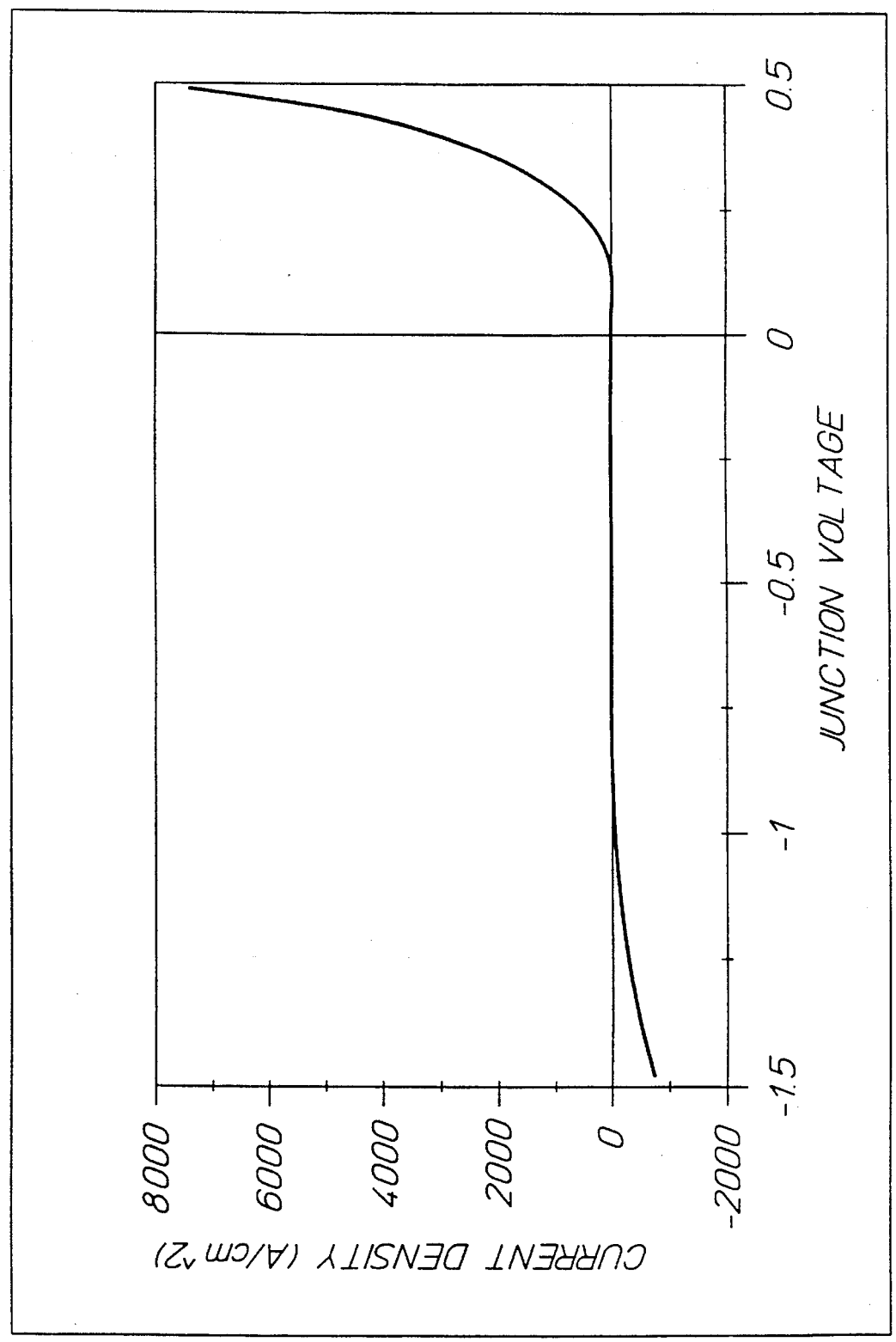
FIG. 2 shows a current-voltage characteristic that was measured using the diode depicted in FIG. 1.

FIG. 2 shows a current-voltage characteristic that was measured using the diode depicted in FIG. 1. As shown in FIG. 2, applying a forward bias to the heterojunction provides a flow of the majority carriers across the heterojunction. Applying a reverse bias to the heterojunction substantially prevents the flow of carriers across the heterojunction.

Figure 3:
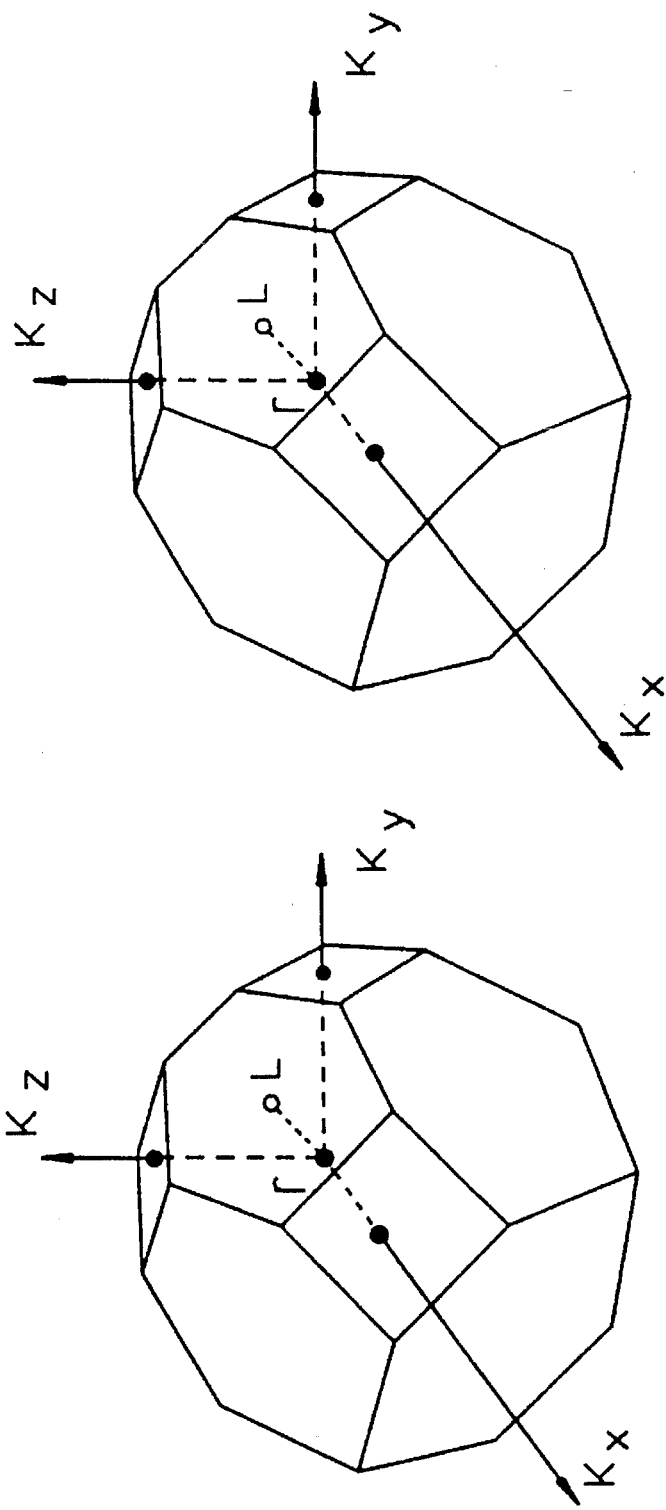
FIG. 3 is a diagram representatively illustrating the Brillouin Zones of the first and second semiconductor materials.

FIG. 3 is a diagram representatively illustrating the Brillouin Zones of the first and second semiconductor materials. In accordance with the preferred embodiment of the invention using the two materials of the AlAs/GaAs superlattice and the InGaAs alloy, the left hand side of FIG. 3 shows an AlAs/GaAs superlattice Brillouin zone 301, while the right hand side shows an InGaAs Brillouin zone 303. As shown in the left hand side of FIG. 3, the AlAs/GaAs has a Brillouin zone that includes an X point in k-space. As shown in the right hand side of FIG. 3, the InGaAs has a Brillouin zone that includes a corresponding X point in k-space. Similarly, as shown in FIG. 3, the two materials have corresponding L points in k-space and Gamma points in k-space.

Figure 4:
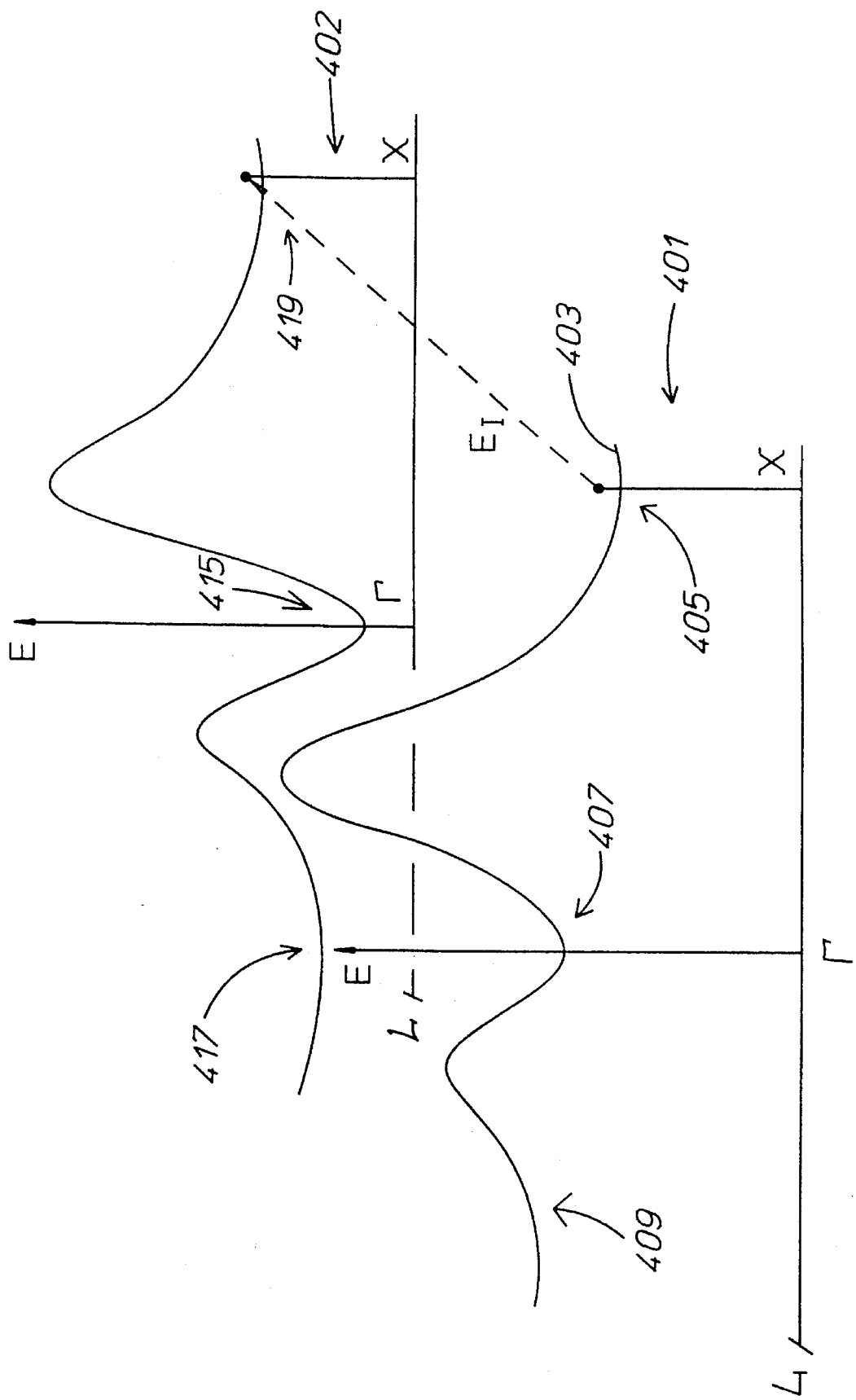
FIG. 4 shows relevant portions of the energy band structure diagrams of the first and second semiconductor materials of the diode of the preferred embodiment depicted in FIG. 1.

FIG. 4 shows relevant portions of the energy band structure diagrams of the first and second semiconductor materials of the diode of the preferred embodiment depicted in FIG. 1, wherein for purposes of illustration only the energy band structure diagram 401 of the first material is drawn in foreground in FIG. 4 and the energy band structure diagram 402 of the second material is drawn in background in FIG. 4. Therefore in accordance with the preferred embodiment of the invention, the foreground of FIG. 4 shows an energy band structure diagram 401 of the AlAs/GaAs superlattice and the background of FIG. 4 shows an energy band structure diagram 402 of the InGaAs alloy. Vertical axes of the energy band structure diagrams correspond to energy, while horizontal axes correspond to Brillouin zone location in k-space.

In accordance with the preferred embodiment, the majority carriers of the first and second semiconductor materials are electrons. Accordingly, as shown in foreground in FIG. 4, the first semiconductor material has a conduction band 403 spanning k-space and a conduction sub-band ordering, which are both associated with the electrons. For example, as shown in foreground in FIG. 4, the AlAs/GaAs superlattice of the first material has a number of conduction sub-bands arranged in a sub-band ordering. As shown, the AlAs/GaAs superlattice of the first material has a Brillouin zone including a conduction band main minimum 405 at a bottom of the conduction band 403 that is located at an X point in k-space, a next lowest conduction band satellite minimum 407 that is located at a Gamma point in k-space, and a next lowest conduction band satellite minimum 409 that is located at an L point in k-space. Accordingly, the conduction sub-band ordering of the AlAs/GaAs superlattice of the first material is X-Gamma-L.

As shown in background in FIG. 4, the InGaAs alloy of the second material has a conduction band including a number of conduction sub-bands arranged in a sub-band ordering that is different than that of the first material. As shown, the InGaAs alloy of the second material has a Brillouin zone including a conduction band main minimum 415 at a bottom of the conduction band that is located at a Gamma point in k-space, a next lowest conduction band satellite minimum 417 that is located at an L point in k-space, and a next lowest conduction band satellite minimum 419 that is located at an X point in k-space. Accordingly, the conduction sub-band ordering of the InGaAs alloy of the second material is Gamma-L-X, which is substantially different than the X-Gamma-L conduction sub-band ordering of the AlAs/GaAs superlattice of the first material.

Although there are corresponding points in k-space in the first and second materials, the respective sub-band orderings of the first and second semiconductor materials are different. Accordingly, the heterojunction includes an energy barrier between sub-bands located at the corresponding points in k-space in the first and second materials. For example, for the AlAs/GaAs superlattice and the InGaAs alloy, although there are corresponding X points in k-space in the two materials, the sub-band ordering in the AlAs/GaAs superlattice is different than the sub-band ordering in the InGaAs alloy. Accordingly, in this example the heterojunction includes an energy barrier between the conduction band main minimum 405 located the X point in the AlAs/GaAs superlattice of the first material and the conduction band satellite minimum 419 located at the corresponding X point in the InGaAs alloy of the second material. As pointed out previously herein, in accordance with the principles of the invention, the second material is sufficiently doped so that under the forward bias the energy barrier is lowered to provide the flow of carriers across the heterojunction.

Furthermore, the heterojunction is sufficiently graded so that under the forward bias an injection energy level of the carriers causes the carriers to pass from a sub-band at a point in k-space in the first material to the sub-band at the corresponding point in k-space in the second material. For example, for the AlAs/GaAs superlattice and InGaAs, the heterojunction therebetween is sufficiently graded so that under the forward bias an injection energy level of the electrons, $E_1$, shown as a dashed line in FIG. 4, causes the electrons to pass from the conduction band main minimum 405 at the X point in the AlAs/GaAs superlattice of the first material to the conduction band satellite minimum 419 at the corresponding X point in the InGaAs alloy of the second material.

Figure 5:
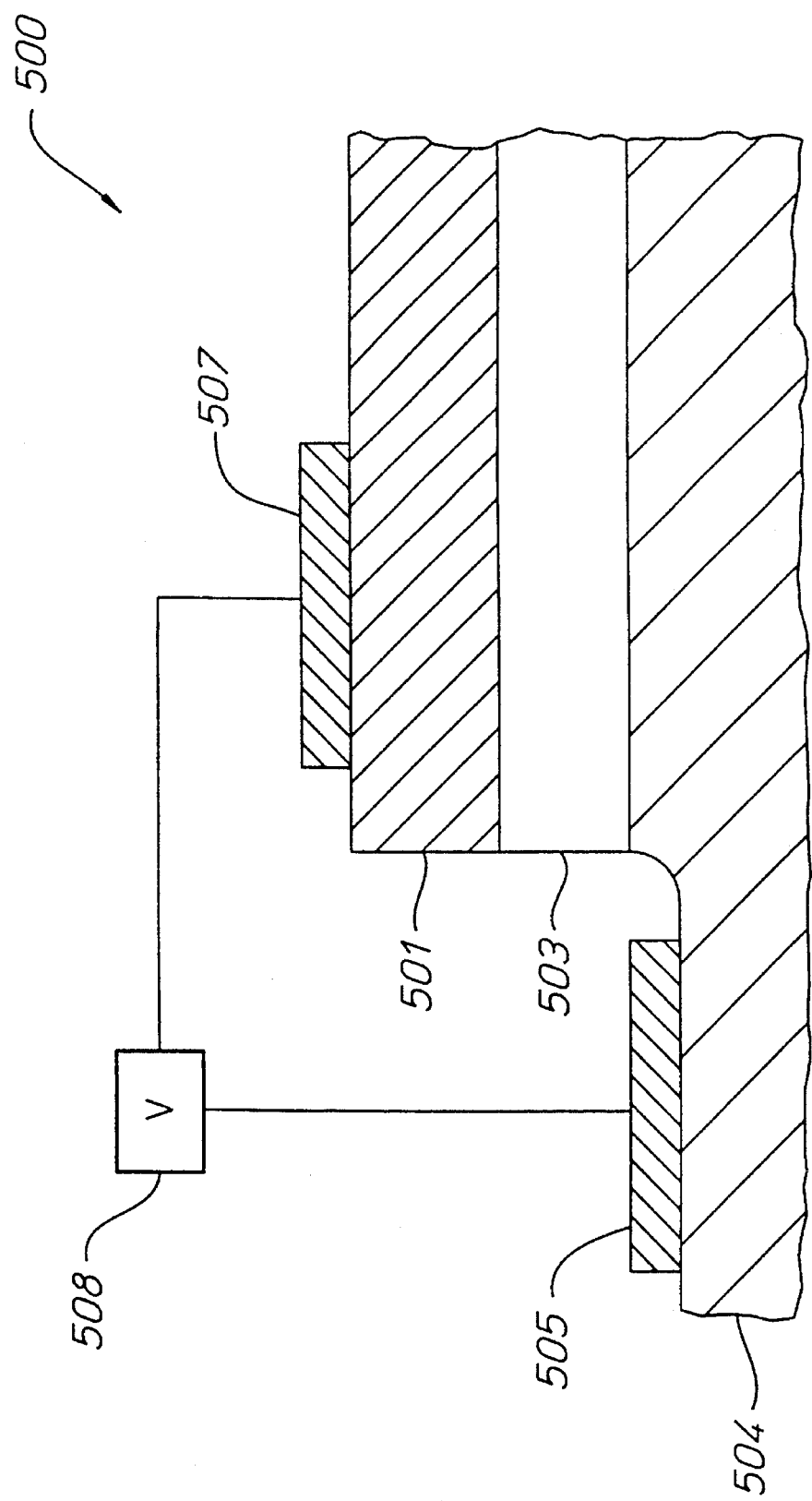
FIG. 5 schematically depicts a diode according to an alternative embodiment of the invention.

FIG. 5 schematically depicts a diode of the invention as embodied in an alternative heteroepitaxial structure 500. As shown, the alternative diode comprises a first semiconductor material 501, preferably InGaAs approximately 1100 Angstroms thick. The diode further comprises a second semiconductor material 503, preferably an AlAs/GaAs superlattice approximately 420 to 1250 angstroms thick, which contacts the first material at a heterojunction. Growth of the superlattice is done by molecular beam epitaxy lattice-matched to a (100)-oriented GaAs substrate 504, which is doped with five times ten to the eighteenth Silicon atoms per cubic centimeter of the GaAs. Electrical contacts 505, 507, preferably MoAu alloy, and a suitable voltage source 508 are coupled to the first and second semiconductor materials for applying voltage to control a flow of the majority carriers across the heterojunction. In particular, after patterning the alternative heterostructure (substantially in the manner shown in FIG. 5) by standard lithography and etching techniques, MoAu alloy is evaporated onto the first and second semiconductor materials to form ohmic contacts.

In the alternative embodiment, the first semiconductor material is doped, except for a region near the heterojunction. More specifically, the InGaAs of the first material 501 shown in FIG. 5 is doped with two times ten to the seventeenth atoms of Silicon per cubic centimeter of the InGaAs, except for an un-doped region of the InGaAs approximately 100 Angstroms thick located near the heterojunction.

The heterojunction is sufficiently graded so that under the forward bias an injection energy level of the carriers causes the carriers to pass from a sub-band at a point in k-space in the first material to the sub-band at the corresponding point in k-space in the second material. For example in the alternative embodiment wherein the first material is the InGaAs and the second material is the AlAs/GaAs superlattice as shown in FIG. 5, the heterojunction therebetween is sufficiently graded so that under the forward bias an injection energy level of the electrons causes the electrons to pass from the conduction band main minimum at the Gamma point in the InGaAs to the conduction band satellite minimum at the corresponding Gamma point in the AlAs/GaAs superlattice. Preferably, the heterojunction of the alternative embodiment is graded by varying layer thickness in the GaAs of the AlAs/GaAs superlattice while the superlattice is being grown by molecular beam epitaxy.

Accordingly, a preferred method for growing the alternative superlattice is to begin by depositing an initial ten pairs of alternating layers of AlAs and GaAs onto the GaAs substrate 504. Each of the ten initial layers of AlAs has a thickness of 9 mL. Each of the ten initial GaAs superlattice layers has a thickness of 6 mL. The superlattice further has a subsequent four pairs of alternating layers of AlAs and un-doped GaAs at a region deposited where the superlattice is to contact the InGaAs. In a first member of the four pairs, the AlAs layer has a thickness of 9 mL, and the GaAs layer has a thickness of 6 mL. In a second member of the four pairs, the AlAs layer has a thickness of 8 ml, and the GaAs layer has a thickness of 6 mL. In a third member of the four pairs, the AlAs layer has a thickness of 6 mL, and the GaAs layer has a thickness of 6 mL. In-a fourth member of the four pairs, the AlAs layer has a thickness of 4 mL, and the GaAs layer has a thickness of 4 mL. Accordingly, the superlattice layers are thinnest near the heterojunction.

In accordance with the principles of the invention, the second material 503 is sufficiently doped so that under the forward bias the energy barrier is lowered to provide the flow of carriers across the heterojunction. For example, in the second material all of the GaAs layers of the initial ten pairs of AlAs/GaA of the alternative superlattice are sufficiently doped with Silicon so that under the forward bias the energy barrier is lowered to provide the flow of carriers across the heterojunction. More specifically, in the alternative embodiment, all of the GaAs layers of the initial ten pairs of AlAs/GaAs layers of the alternative superlattice are heavily doped with one times ten to the nineteenth Silicon atoms per cubic centimeter of the GaAs. In the alternative embodiment of FIG. 5, all of the AlAs layers are undoped.

Figure 6:
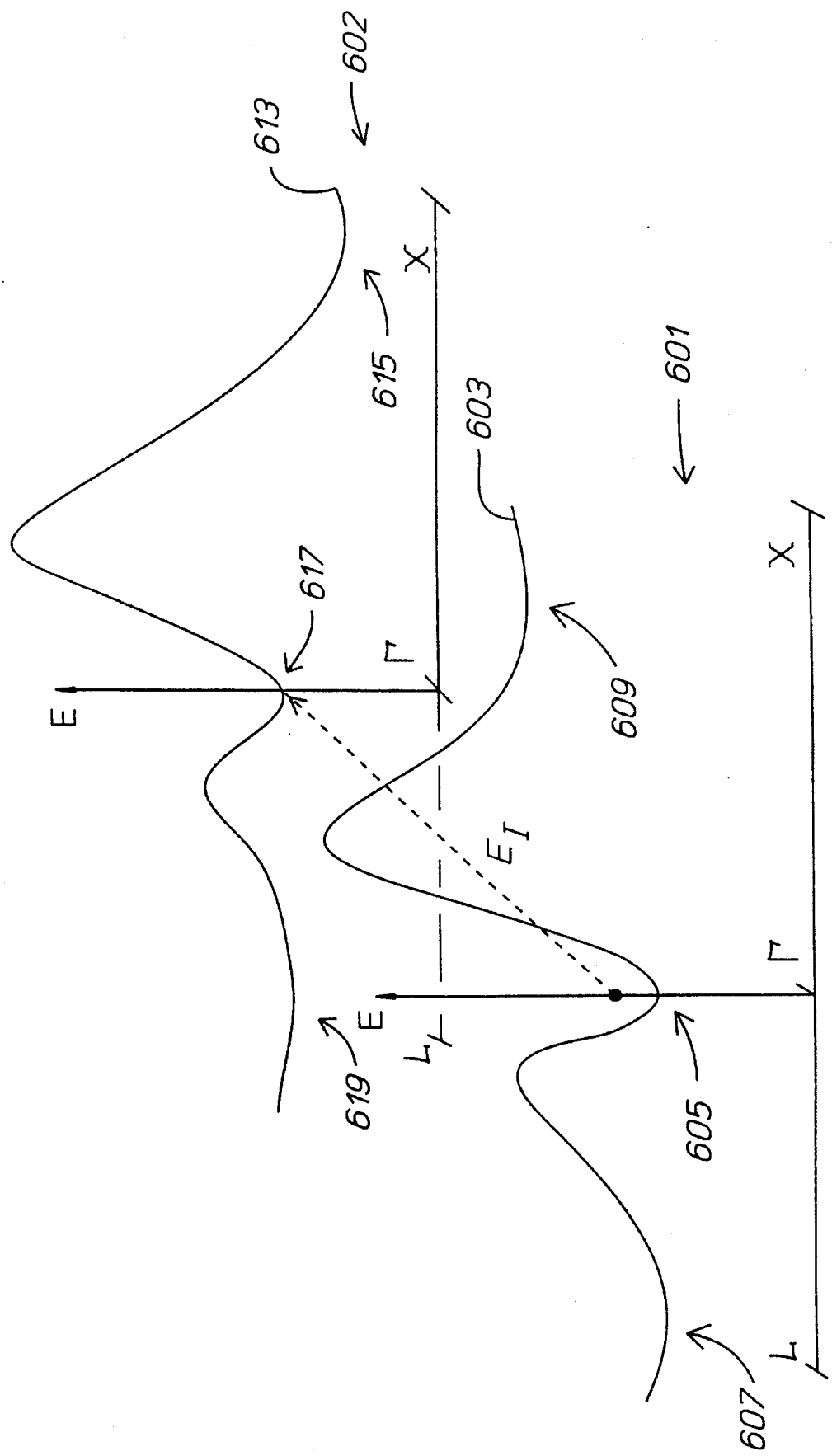
FIG. 6 shows relevant portions of the energy band structure diagrams of the first and second semiconductor materials of the alternative embodiment of the diode depicted in FIG. 5.

FIG. 6 shows relevant portions of the energy band structure diagrams of the first and second semiconductor materials of the diode of the alternative embodiment depicted in FIG. 5, wherein for purposes of illustration only the energy band structure diagram 601 of the first material is drawn in foreground in FIG. 6 and the energy band structure diagram 602 of the second material is drawn in background in FIG. 6. Therefore in accordance with the alternative embodiment of the invention, the foreground of FIG. 6 shows an energy band structure diagram 601 of the InGaAs alloy and the background of FIG. 6 shows an energy band structure diagram 602 of the AlAs/GaAs superlattice. Vertical axes of the energy band structure diagrams correspond to energy, while horizontal axes correspond to Brillouin zone location in k-space.

In accordance with the alternative embodiment, the majority carriers of the first and second semiconductor materials are electrons. Accordingly, as shown in foreground in FIG. 6, the first semiconductor material has a conduction band 603 spanning k-space and a conduction sub-band ordering, which are both associated with the electrons. For example, as shown in foreground in FIG. 6, the InGaAs of the first material has a number of conduction sub-bands arranged in a sub-band ordering. As shown, the InGaAs of the first material has a Brillouin zone including a conduction band main minimum 605 at a bottom of the conduction band 603 that is located at an Gamma point in k-space, a next lowest conduction band satellite minimum 607 that is located at an L point in k-space, and a next lowest conduction band satellite minimum 609 that is located at an X point in k-space. Accordingly, the conduction sub-band ordering of the InGaAs of the first material is Gamma-L-X.

As shown in background in FIG. 6, the AlAs/GaAs superlattice of the second material has a conduction band including a number of conduction sub-bands arranged in a sub-band ordering that is different than that of the first material. As shown, the AlAs/GaAs of the second material has a Brillouin zone including a conduction band main minimum 615 at a bottom of the conduction band that is located at an X point in k-space, a next lowest conduction band satellite minimum 617 that is located at a Gamma point in k-space, and a next lowest conduction band satellite minimum 619 that is located at an L point in k-space. Accordingly, the conduction sub-band ordering of the AlAs/GaAs superlattice of the second material is X-Gamma-L, which is substantially different than the Gamma-L-X conduction sub-band ordering of the InGaAs superlattice of the first material.

Although there are corresponding points in k-space in the first and second materials, the respective sub-band orderings of the first and second semiconductor materials are different. Accordingly, in the alternative embodiment the heterojunction includes an energy barrier between sub-bands located at the corresponding points in k-space in the first and second materials. For example, for the AlAs/GaAs superlattice and the InGaAs, although there are corresponding Gamma points in k-space in the two materials, the sub-band ordering in the AlAs/GaAs superlattice is different than the sub-band ordering in InGaAs. Accordingly, in the alternative embodiment the heterojunction includes an energy barrier between the conduction band main minimum located at the Gamma point in the InGaAs of the first material and the conduction band satellite minimum located at the corresponding Gamma point in the AlAs/GaAs superlattice of the second material. As pointed out previously herein, in accordance with the principles of the invention, the second material is sufficiently doped so that under the forward bias the energy barrier is lowered to provide the flow of carriers across the heterojunction.

Furthermore, the heterojunction is sufficiently graded so that under the forward bias an injection energy level of the carriers causes the carriers to pass from a sub-band at a point in k-space in the first material to the sub-band at the corresponding point in k-space in the Second material. For, example, for the AlAs/GaAs superlattice and InGaAs, the heterojunction therebetween is sufficiently graded so that under the forward bias an injection energy level of the electrons, $E_1$ shown as a dashed line in FIG. 6, causes the electrons to pass from the conduction band main minimum at the Gamma point in the InGaAs of the first material to the conduction band satellite minimum at the corresponding Gamma point in the AlAs/GaAs superlattice of the second material.

Of course, the present invention is not strictly limited to materials having an X-Gamma-L or Gamma-L-X conduction band ordering for the first semiconductor material of the diode, and having a Gamma-L-X or X-Gamma-L conduction sub-band ordering for the second semiconductor material diode. A guiding principle of the invention is that the first semiconductor material of the diode has a sub-band ordering associated with the majority carriers and that the second semiconductor material of the diode has a sub-band ordering associated with the majority carriers that is different from that of the first semiconductor material. Accordingly, other embodiments of the invention have a sub-band ordering for the first semiconductor material of the diode different than that of AlAs/GaAs superlattice or the InGaAs. Similarly, it should be understood that some embodiments of the invention have sub-band ordering different than that of InGaAs alloy or the AlAs/GaAs superlattice.

Additionally, it should be understood that while it is preferred to use an AlAS/GaAs superlattice, which has a conduction band main minimum at an X point in k-space, in alternative embodiments substitution of alternative semiconductor materials that have a conduction band main minimum provides beneficial results. For example, alternative semiconductor materials such as GaP, and AlP, each have a conduction band main minimum at an X point in k-space. Silicon has a conduction band main minimum substantially located at an X point in k-space.

Similarly, it should be understood that while it is preferred to use the InGaAs alloy, which has a conduction band main minimum at a Gamma point in k-space, in alternative embodiments substitution of alternative semiconductor materials that have a conduction band main minimum at Gamma provides beneficial results. For example, alternative semiconductor materials such as InAs, InP, InSb, and GaSb each have a conduction band main minimum at a Gamma point in k-space. Additionally, substitution of other alterative semiconductor materials which have a conduction band main minimum at an L point such as Germanium or PbTe for the AlAs/GaAs superlattice or the InGaAs provides some advantages.

Furthermore, it should be understood that the present invention is not strictly limited to materials having electrons as majority carriers. Since another guiding principle of the invention is that the first and second semiconductor materials have the same majority carriers, it should be understood that in some alternative embodiments, holes are the majority carriers in the first and second semiconductor materials. Accordingly, in the first semiconductor material the sub-band ordering associated with the majority carriers is a valence sub-band ordering associated with the holes. Similarly, in the second semiconductor material, the sub-band ordering associated with the majority carriers is a valence sub-band ordering that is different from the valence sub-band of the first semiconductor material.

In embodiments having holes as majority carriers, the heterojunction includes an energy barrier between valence sub-bands located at the corresponding points in k-space in the first and second materials. The second material is sufficiently doped so that under the forward bias the energy barrier is lowered to provide the flow of carriers across the heterojunction. The heterojunction is sufficiently graded so that under the forward bias an injection energy level of the carriers causes the carriers to pass from a valence sub-band at a point in k-space in the first material to the valence sub-band at the corresponding point in k-space in the second material.

For example, in another alternative embodiment the first material is PbTe and the second material is InSb. Although there are corresponding L points in k-space in the two materials, the sub-band ordering of the PbTe of the first material is different than the sub-band ordering of the InSb of the second material. Accordingly, in the alternative embodiment there is a heterojunction between the Pbte and the Insb, which includes an energy barrier between a valence band main maximum located an L point in the PbTe of the first material and the valence band satellite maximum located at the corresponding L point in the InSb of the second material. As pointed out previously herein, in accordance with the principles of the invention, the second material is sufficiently doped so that under the forward bias the energy barrier is lowered to provide the flow of carriers across the heterojunction.

Furthermore, the heterojunction is sufficiently graded so that under the forward bias an injection energy level of the carriers causes the carriers to pass from a sub-band at a point in k-space in the first material to the sub-band at the corresponding point in k-space in the second material. For example, for the PbTe and InSb, the heterojunction therebetween is sufficiently graded using grading techniques known to those with ordinary skill in the art so that under the forward bias an injection energy level, $E_i$, causes the carriers to pass from the valence band main maximum at the L point in the PbTe of the first material to the valence band satellite maximum at the L point in the InSb of the second material.

The semiconductor diode of the present invention provides a reduced recovery time, at room temperature and independent of any minority carrier recombination. It is theorized that in the semiconductor diode of the present invention, a recovery is time dependent upon scattering of carriers to various energy sub-bands within a heterojunction of two different semiconductor materials. For example, it is theorized that in the preferred embodiment, electrons conducted into the X satellite minimum of the InGaAs under the forward bias, are scattered into the Gamma main minimum of the InGaAs when the forward bias is suddenly changed to the reverse bias. Since a time of such scattering is extremely short, it is theorized that the diode of present invention provides a recovery time on the order of 1 picosecond or less at room temperature.

Although specific embodiments of the invention have been described and illustrated, the invention is not to be limited to the specific forms or arrangements of parts so described and illustrate, and various modifications and changes can be made without departing from the scope and spirit of the invention. Within the scope of the appended claims, therefore, the invention may be practiced otherwise than as specifically described and illustrated.

What is claimed is:

1. A diode comprising:

a first semiconductor material having a type of majority carriers, having a main sub-band, and having a sub-band ordering associated with the majority carriers;

a second semiconductor material arranged so as to contact the first material at a region, the second semiconductor material having the same type of majority carriers as the first semiconductor material, the second material further having a satellite sub-band, and having a sub-band ordering associated with the majority carriers that is different from that of the first semiconductor material;

a heterojunction comprising the region where the second semiconductor material contacts the first semiconductor material; the heterojunction including an energy barrier between the main sub-band of the first semiconductor material and the satellite sub-band of the second semiconductor material; and a first electrical contact and a second electrical contact respectively coupled to each of the first and second semiconductor materials for applying a voltage to control a flow of the majority carriers across the heterojunction.

2. A diode as in claim 1 wherein:

the majority carriers of the first and second semiconductor materials are electrons;

in the first semiconductor material the sub-band ordering associated with the majority carriers is a conduction sub-band ordering associated with the electrons; and in the second semiconductor material the sub-band ordering associated with the majority carriers is a conduction sub-band ordering that is different from the conduction sub-band ordering of the first semiconductor material.

3. A diode as in claim 1 wherein:

the majority carriers of the first and second semiconductor materials are holes;

in the first semiconductor material the sub-band ordering associated with the majority carriers is a valence sub-band ordering associated with the holes; and in the second semiconductor material the sub-band ordering associated with the majority carriers is a valence sub-band ordering that is different from the valence sub-band ordering of the first semiconductor material.

4. A diode as in claim 1 wherein the electrical contacts are adapted for applying a forward bias to the heterojunction so as to provide a flow of the majority carriers across the heterojunction.

5. A diode as in claim 4 wherein: the majority carriers are electrons;

the first semiconductor material has a Brillouin zone including a conduction band main minimum substantially located at an X point;

the second semiconductor material has another Brillouin zone including a conduction band satellite minimum substantially located at an X point;

the heterojunction includes an energy barrier between the main minimum substantially located at the X point of the first semiconductor material and the satellite minimum substantially located at the X point of the second semiconductor material; and the second semiconductor material is doped so that under the forward bias the energy barrier is lowered to provide the flow of electrons across the heterojunction.

6. A diode as in claim 5 wherein the heterojunction is a graded heterojunction having a grading profile, the grading profile being sufficiently gradual so that under the forward bias an injection energy level of the electrons causes the electrons to pass from the conduction band main minimum substantially located at the X point in the first semiconductor material to the conduction band satellite minimum substantially located at the X point of the second semiconductor material.

7. A diode as in claim 4 wherein:

the majority carriers are electrons;

the first semiconductor material has a Brillouin zone including a conduction band main minimum substantially located at a Gamma point;

the second semiconductor material has another Brillouin zone including a conduction band satellite minimum substantially located at a Gamma point;

the heterojunction includes an energy barrier between the main minimum substantially located at the Gamma point of the first semiconductor material and the satellite minimum substantially located at the Gamma point of the second semiconductor material; and the second semiconductor material is doped so that under the forward bias the energy barrier is lowered to provide the flow of electrons across the heterojunction.

8. A diode as in claim 7 wherein the heterojunction is a graded heterojunction having a grading profile, the grading profile being sufficiently gradual so that under the forward bias an injection energy level of the electrons causes the electrons to pass from the conduction band main minimum substantially located at the Gamma point in the first semiconductor material to the conduction band satellite minimum substantially located at the Gamma point of the second semiconductor material.

9. A diode as in claim 4 wherein: the majority carriers are electrons;

the first semiconductor material has a Brillouin zone including a conduction band main minimum substantially located at an L point;

the second semiconductor material has another Brillouin zone including a conduction band satellite minimum substantially located at an L point;

the heterojunction includes an energy barrier between the main minimum substantially located at the L point of the first semiconductor material and the satellite minimum substantially located at the L point of the second semiconductor material; and the second semiconductor material is doped so that under the forward bias the energy barrier is lowered to provide the flow of electrons across the heterojunction.

10. A diode as in claim 4 wherein:

the majority carriers are holes;

the first semiconductor material has a Brillouin zone including a valence band main maximum substantially located at an L point;

the second semiconductor material has another Brillouin zone including a valence band satellite maximum substantially located at an L point;

the heterojunction includes an energy barrier between the main maximum substantially located at the L point of the first semiconductor material and the satellite maximum substantially located at the L point of the second semiconductor material; and the second semiconductor material is doped so that under the forward bias the energy barrier is lowered to provide the flow of holes across the heterojunction.

11. A diode as in claim 4 wherein the heterojunction is a graded heterojunction having a grading profile, the grading profile being sufficiently gradual so that under the forward bias an injection energy level of the carriers causes the carriers to pass from a sub-band substantially located at a momentum point in k-space in the first semiconductor material to a sub-band substantially located at a corresponding momentum point in k-space in the second semiconductor material.

12. A diode as in claim 4 wherein:

the first semiconductor material has a sub-band substantially located at an X point in k-space in the first semiconductor material;

the second semiconductor material has a sub-band substantially located at an X point in k-space in the second semiconductor material;

the heterojunction includes an energy barrier between the sub-band substantially located at the X point in k-space in the first semiconductor material and the sub-band substantially located at the X point in k-space in the second semiconductor material; and the second semiconductor material is sufficiently doped so that under the forward bias the energy barrier is lowered to provide the flow of carriers between the sub-band substantially located at the X point in k-space in the first semiconductor material and the sub-band substantially located at the X point in k-space in the second semiconductor material.

13. A diode as in claim 4 wherein:

the first semiconductor material has a sub-band substantially located at a Gamma point in k-space in the first semiconductor material;

the second semiconductor material has a sub-band substantially located at a Gamma point in k-space in the second semiconductor material;

the heterojunction includes an energy barrier between the sub-band substantially located at the Gamma point in k-space in the first semiconductor material and the sub-band substantially located at the Gamma point in k-space in the second semiconductor material; and the second semiconductor material is sufficiently doped so that under the forward bias the energy barrier is lowered to provide the flow of carriers between the sub-band substantially located at the Gamma point in k-space in the first semiconductor material and the sub-band substantially located at the Gamma point in k-space in the second semiconductor material.

14. A diode as in claim 4 wherein:

the first and second semiconductor materials have sub-bands substantially located at corresponding momentum points in k-space in the first and second semiconductor materials;

the heterojunction includes an energy barrier between the sub-bands substantially located at the corresponding momentum points in k-space in the first and second semiconductor materials; and the second semiconductor material is sufficiently doped so that under the forward bias the energy barrier is lowered to provide the flow of carders between the sub-bands substantially located at the corresponding momentum points in k-space in the first and second semiconductor materials.

15. A diode as in claim 1 wherein the electrical contacts are adapted for applying a reverse bias to the heterojunction so as to substantially prevent a flow of the majority carriers across the heterojunction.

16. A diode as in claim 15 wherein:

the majority carriers are electrons;

the first semiconductor material has a Brillouin zone including a conduction band main minimum substantially located at an X point;

the second semiconductor material has another Brillouin zone including a conduction band satellite minimum substantially located at an X point;

the heterojunction includes an energy barrier between the main minimum substantially located at the X point of the first semiconductor material and the satellite minimum substantially located at the X point of the second semiconductor material; and the second semiconductor material is doped so that under the reverse bias the energy barrier is raised to substantially prevent the flow of electrons across the heterojunction.

17. A diode as in claim 15 wherein:

the majority carriers are electrons;

the first semiconductor material has a Brillouin zone including a conduction band main minimum substantially located at a Gamma point;

the second semiconductor material has another Brillouin zone including a conduction band satellite minimum substantially located at a Gamma point; the heterojunction includes an energy barrier between the main minimum substantially located at the Gamma point of the first semiconductor material and the satellite minimum substantially located at the Gamma point of the second semiconductor material; and the second semiconductor material is doped so that under the reverse bias the energy barrier is raised to substantially prevent the flow of electrons across the heterojunction.

18. A diode as in claim 15 wherein:

the majority carriers are electrons;

the first semiconductor material has a Brillouin zone including a conduction band main minimum substantially located at an L point;

the second semiconductor material has another Brillouin zone including a conduction band satellite minimum substantially located at an L point;

the heterojunction includes an energy barrier between the main minimum substantially located at the L point of the first semiconductor material and the satellite minimum substantially located at the L point of the second semiconductor material; and the second semiconductor material is doped so that under the reverse bias the energy barrier is raised to substantially prevent the flow of electrons across the heterojunction,

19. A diode as in claim 15 wherein:

the majority carriers are holes;

the first semiconductor material has a Brillouin zone including a valence band main maximum substantially located at an L point;

the second semiconductor material has another Brillouin zone including a valence band satellite maximum substantially located at an L point;

the heterojunction includes an energy barrier between the main maximum substantially located at the L point of the first semiconductor material and the satellite maximum substantially located at the L point of the second semiconductor material; and the second semiconductor material is doped so that under the reverse bias the energy barrier is raised to substantially prevent the flow of holes across the heterojunction.

20. A diode as in claim 1 wherein the second semiconductor material includes a strained lattice.

* * * * *